United States Patent
Koya et al.

(10) Patent No.: US 10,629,591 B2
(45) Date of Patent: Apr. 21, 2020

(54) SEMICONDUCTOR DEVICE

(71) Applicant: Murata Manufacturing Co., Ltd., Kyoto-fu (JP)

(72) Inventors: Shigeki Koya, Nagaokakyo (JP); Takayuki Tsutsui, Nagaokakyo (JP); Kazuhito Nakai, Nagaokakyo (JP); Yusuke Tanaka, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/243,943

(22) Filed: Jan. 9, 2019

(65) Prior Publication Data
US 2019/0214382 A1  Jul. 11, 2019

(30) Foreign Application Priority Data
Jan. 10, 2018 (JP) .................. 2018-002030

(51) Int. Cl.
*H01L 27/06* (2006.01)
*H01L 23/522* (2006.01)
*H01L 23/528* (2006.01)
*H01L 29/66* (2006.01)

(52) U.S. Cl.
CPC .......... *H01L 27/067* (2013.01); *H01L 23/528* (2013.01); *H01L 23/5223* (2013.01); *H01L 23/5226* (2013.01); *H01L 23/5228* (2013.01); *H01L 29/66242* (2013.01)

(58) Field of Classification Search
CPC ............ H01L 27/067; H01L 29/66242; H01L 23/5228; H01L 23/5226; H01L 23/528; H01L 23/5223
See application file for complete search history.

(56) References Cited

U.S. PATENT DOCUMENTS

| | | | | |
|---|---|---|---|---|
| 6,034,383 | A | * 3/2000 | Bayraktaroglu | .... H01L 29/0692 257/197 |
| 6,586,782 | B1 | * 7/2003 | Finlay | .................. H01L 27/082 257/197 |
| 2005/0218990 | A1 | 10/2005 | Makioka | |
| 2006/0267714 | A1 | * 11/2006 | Fushimi | ............... H01H 73/045 335/172 |

FOREIGN PATENT DOCUMENTS

JP  2012-109320 A  6/2012

* cited by examiner

*Primary Examiner* — Yasser A Abdelaziez
(74) *Attorney, Agent, or Firm* — Studebaker & Brackett PC

(57) ABSTRACT

A semiconductor device includes a plurality of unit transistors that are arranged on a surface of a substrate in a first direction. Input capacitive elements are arranged so as to correspond to the unit transistors. An emitter common wiring line is connected to emitter layers of the unit transistors. A via-hole extending from the emitter common wiring line to a back surface of the substrate is disposed at a position overlapping the emitter common wiring line. A collector common wiring line is connected to collector layers of the unit transistors. The input capacitive elements, the emitter common wiring line, the unit transistors, and the collector common wiring line are arranged in this order in a second direction. Base wiring lines that connect the input capacitive elements to base layers of the corresponding unit transistors intersect the emitter common wiring line without physical contact.

20 Claims, 6 Drawing Sheets

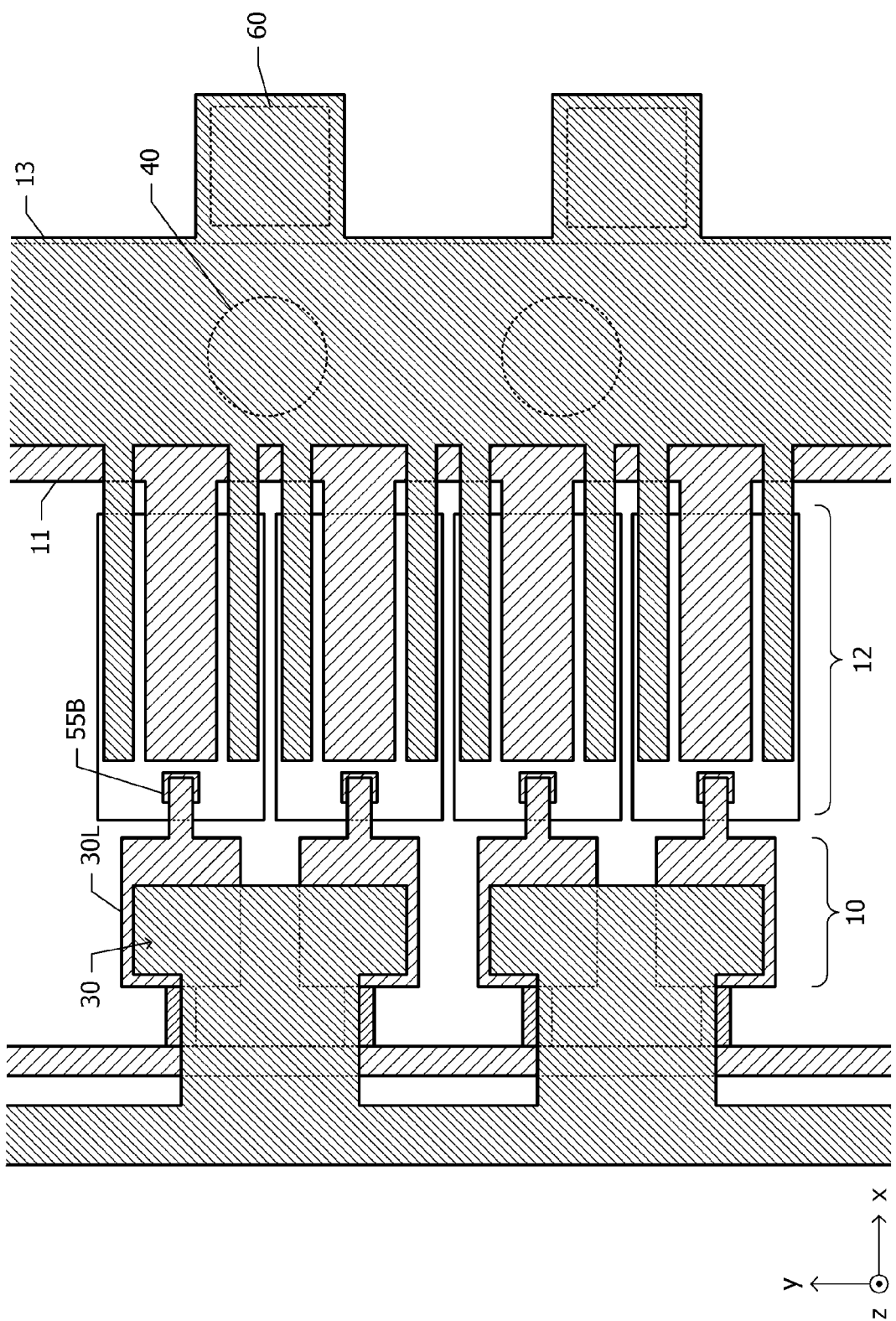

SEMICONDUCTOR DEVICE

CROSS-REFERENCE TO RELATED APPLICATION

This application claims benefit of priority to Japanese Patent Application No. 2018-002030, filed Jan. 10, 2018, the entire content of which is incorporated herein by reference.

BACKGROUND

Technical Field

The present disclosure relates to a semiconductor device.

Background Art

With the advance of smartphones, an improvement in the communication speed of mobile communication systems has been desired. A technology called carrier aggregation in which carriers of a plurality of bands are bound together has been introduced as a technology for improving the communication speed. In the case where the carrier aggregation is applied to global terminals used in a plurality of countries or regions, a front end including, for example, a power amplifier, a filter, and a switch for radio frequencies of mobile terminals has a complex configuration, resulting in an increase in a loss in a front-end portion. In order to obtain a sufficient transmission power required for the mobile terminals, the output power required for a power amplifier that amplifies transmission signals has been increasing.

In addition, with an increase in the frequency used in mobile communication systems, a coverage area provided by one base station has been decreasing. High power user equipment (HPUE), which is a mobile terminal whose output power is increased, has been desired so that a wide coverage area is provided by a single base station. In order to keep pace with HPUE, power amplifiers of mobile terminals are required to output larger electric power.

Japanese Unexamined Patent Application Publication No. 2012-109320 discloses a power amplifier that uniformly operates a plurality of transistors to realize a low power consumption and good distortion characteristics. The power amplifier disclosed in Japanese Unexamined Patent Application Publication No. 2012-109320 includes a matching capacitor to which a radio-frequency signal is input and a transistor row in which a plurality of transistors are arranged in a predetermined direction. The matching capacitor includes an upper-layer electrode and a lower-layer electrode. The transistor row amplifies the radio-frequency signal output from the lower-layer electrode of the matching capacitor.

In a region adjacent to the transistor row, a grounded via-hole that is connected to emitters is formed at a distance substantially equal from both ends of the transistor row. The lower-layer electrode of the matching capacitor is a microstrip line that is disposed so that a radio-frequency signal is uniformly distributed with the via-hole therebetween. The lower-layer electrode is connected to base terminals of the plurality of transistors.

SUMMARY

In the power amplifier disclosed in Japanese Unexamined Patent Application Publication No. 2012-109320, the lower-layer electrode of the matching capacitor is arranged in a direction in which the plurality of transistors are arranged so that the via-hole is arranged between the lower-layer electrode and the transistor row. Via-holes cannot be arranged in this region where the lower-layer electrode is arranged. Therefore, the number of via-holes is limited. Transistors that are distant from the via-hole have high emitter resistances, and it is difficult to improve characteristics such as gains.

Accordingly, the present disclosure provides a semiconductor device capable of reducing the emitter resistance without increasing the collector resistance and having a configuration suitable for high-output operation.

A semiconductor device according to a first aspect of the present disclosure includes a plurality of unit transistors that are arranged on a first surface of a substrate in a first direction and that each include a base layer, an emitter layer, and a collector layer; input capacitive elements arranged so as to correspond to the unit transistors and connected to the base layers of the corresponding unit transistors; an emitter common wiring line connected to the emitter layers of the unit transistors; a via-hole that is disposed at a position overlapping the emitter common wiring line and that extends from the emitter common wiring line to a second surface of the substrate, the second surface being opposite to the first surface; and a collector common wiring line connected to the collector layers of the unit transistors. In the semiconductor device, an input capacitor region in which the input capacitive elements are arranged, the emitter common wiring line, a transistor region in which the unit transistors are arranged, and the collector common wiring line are arranged in this order in a second direction intersecting the first direction, and base wiring lines that connect the input capacitive elements to the base layers of the corresponding unit transistors intersect the emitter common wiring line without physical contact.

The input capacitive elements do not affect the arrangement of the via-hole. Therefore, the distance from the via-hole to the unit transistors can be shortened. As a result, the emitter resistance can be reduced without increasing the collector resistance. Thus, a decrease in the output power can be suppressed to realize an improvement in the gain.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 6 is a plan view of a semiconductor device according to a comparative example.

DETAILED DESCRIPTION

First Embodiment

Figure 1:
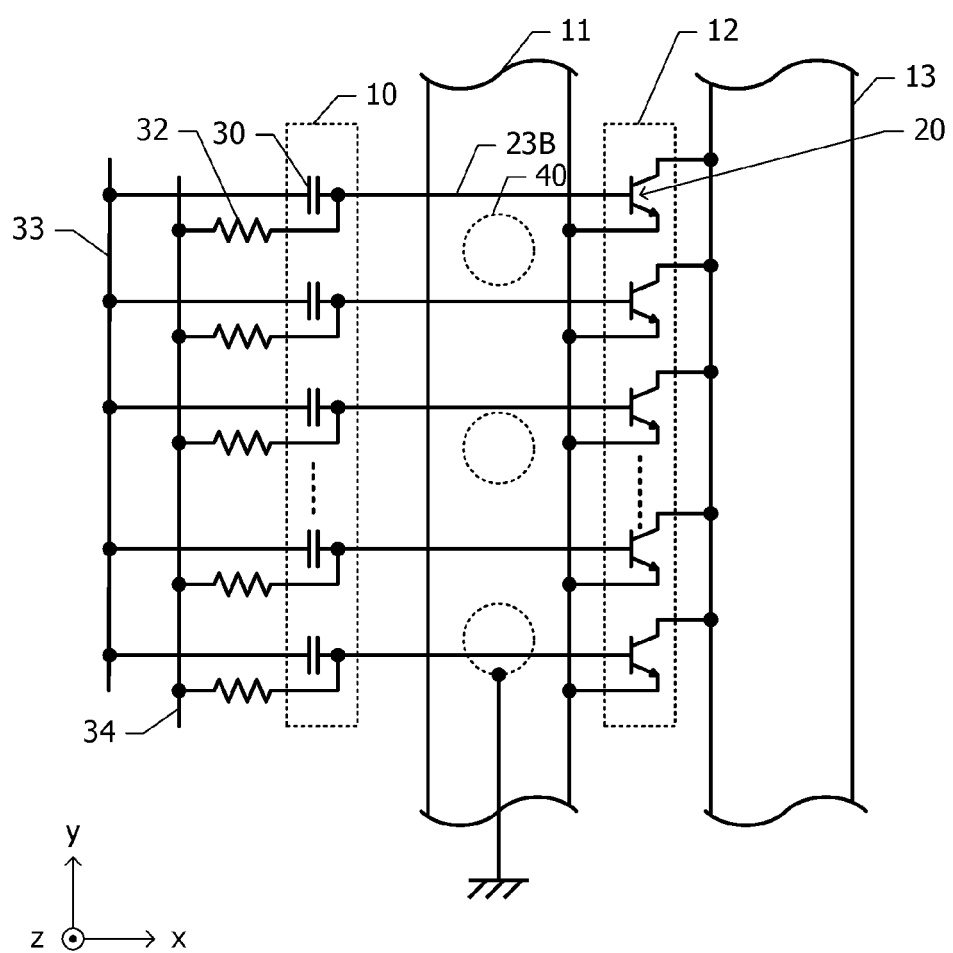
FIG. 1 is a schematic diagram illustrating a planar arrangement of a semiconductor device according to a first embodiment.

A semiconductor device according to a first embodiment will be described with reference to FIGS. 1 to 3B. FIG. 1 is a schematic diagram illustrating a planar arrangement of a semiconductor device according to the first embodiment. The semiconductor device according to the first embodiment includes a substrate made of a semiconductor, and a plurality of active elements, a plurality of passive elements, and a plurality of wiring lines are formed on the substrate. An xyz orthogonal coordinate system is defined in which a first surface the substrate is defined as an xy plane and a normal direction of the first surface is defined as a positive direction of a z-axis.

A plurality of unit transistors 20 each including a base layer, an emitter layer, and a collector layer are arranged on the first surface of the substrate in a y-axis direction. Input capacitive elements 30 are arranged so as to correspond to the plurality of unit transistors 20. The plurality of input capacitive elements 30 are also arranged in the y-axis direction and connected to the base layers of the corresponding unit transistors 20.

The emitter layers and the collector layers of the unit transistors 20 are connected to an emitter common wiring line 11 and a collector common wiring line 13, respectively. A plurality of via-holes 40 are arranged at positions overlapping the emitter common wiring line 11. Each of the via-holes 40 extends from the emitter common wiring line 11 to a second surface of the substrate, the second surface being opposite to the first surface. A ground plane is disposed on the second surface of the substrate. The emitter common wiring line 11 is connected through the via-holes 40 to the ground plane formed on the second surface of the substrate.

As illustrated in FIG. 1, an input capacitor region 10 in which the plurality of input capacitive elements 30 are arranged, the emitter common wiring line 11, a transistor region 12 in which the plurality of unit transistors 20 are arranged, and the collector common wiring line 13 are arranged in this order in an x-axis direction.

One of electrodes of each of the input capacitive elements 30 is connected to the base layer of the corresponding unit transistor 20 with a base wiring line 23B interposed therebetween. The base wiring lines 23B intersect the emitter common wiring line 11 without physical contact with the emitter common wiring line 11. The base wiring lines 23B intersect the emitter common wiring line 11 without being electrically short-circuited to the emitter common wiring line 11. The other electrode of each of the input capacitive elements 30 is connected to a common input signal wiring line 33. A radio-frequency input signal is supplied to the base layers of the unit transistors 20 through the input signal wiring line 33, the input capacitive elements 30, and the base wiring lines 23B.

The electrode of each of the input capacitive elements 30, the electrode being connected to the corresponding unit transistor 20, is connected to a common bias wiring line 34 with a resistive element 32 interposed therebetween. A bias current or a bias voltage is supplied to the base layers of the unit transistors 20 through the bias wiring line 34 and the resistive elements 32.

As described above, the semiconductor device according to the first embodiment includes a plurality of unit transistors 20 that are connected together in parallel and is used as, for example, the output stage of a power amplifier.

Figure 2:
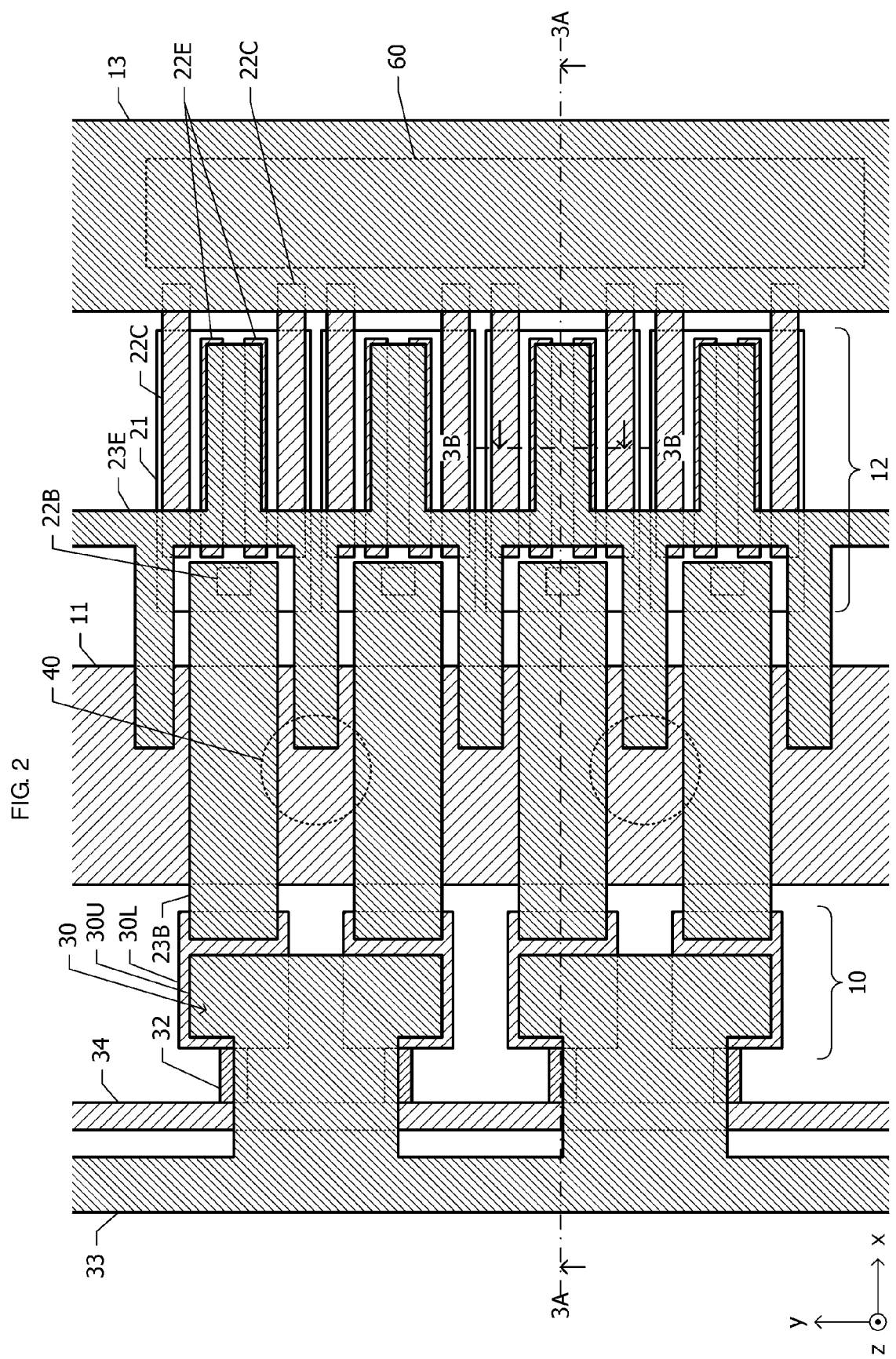
FIG. 2 is a plan view of a semiconductor device according to the first embodiment.

FIG. 2 is a plan view of a semiconductor device according to the first embodiment. An input capacitor region 10, an emitter common wiring line 11, a transistor region 12, and a collector common wiring line 13 are arranged in this order in the x-axis direction.

In the transistor region 12, a plurality of active regions 21 are arranged in the y-axis direction. A unit transistor 20 (FIG. 1) is arranged in each of the plurality of active regions 21. The unit transistor 20 is, for example, a heterojunction bipolar transistor including a collector layer, a base layer, and an emitter layer.

At least two metal wiring layers are disposed on a substrate. A collector wiring line 22C, a base wiring line 22B, and an emitter wiring line 22E that are included in a first-layer wiring layer are arranged in each of the active regions 21. The collector wiring line 22C and the emitter wiring line 22E are each formed by a pair of conductor patterns. The first-layer base wiring line 22B is arranged on the side close to the emitter common wiring line 11 (on the left side in FIG. 2) in the active region 21. A base electrode that is ohmically connected to the base layer is disposed under the first-layer base wiring line 22B. The base electrode extends from a region overlapping the first-layer base wiring line 22B toward the side opposite to the emitter common wiring line 11 (the right side in FIG. 2) in parallel to the x-axis.

The pair of conductor patterns of the first-layer emitter wiring line 22E are arranged adjacent to the base electrode, which is long in the x-axis direction (on the upper side and the lower side in FIG. 2). Each of the conductor patterns that form the emitter wiring line 22E also has a planar shape that is long in the x-axis direction. Emitter electrodes that are ohmically connected to the emitter layers are disposed under the pair of conductor patterns of the first-layer emitter wiring line 22E.

The pair of conductor patterns of the first-layer collector wiring line 22C are arranged adjacent to the first-layer emitter wiring line 22E (on the upper side and the lower side in FIG. 2). Collector electrodes that are ohmically connected to the collector layers are disposed under the first-layer collector wiring line 22C.

The collector common wiring line 13 included in a second-layer wiring layer is arranged on one side of the transistor region 12 (the right side in FIG. 2). The collector common wiring line 13 overlaps portions of the first-layer collector wiring lines 22C of the unit transistors 20 and is connected to the first-layer collector wiring lines 22C through interlayer connection vias provided in the overlapping portions. An opening is provided in a protective film that covers the collector common wiring line 13 to expose a portion of the collector common wiring line 13. This exposed portion functions as a pad 60 for collectors, the pad 60 being used for connecting to an external circuit.

A second-layer emitter wiring line 23E is arranged so as to overlap the first-layer emitter wiring lines 22E. The second-layer emitter wiring line 23E is connected to the first-layer emitter wiring lines 22E through interlayer connection vias provided in portions in which the second-layer emitter wiring line 23E overlaps the first-layer emitter wiring lines 22E.

The second-layer emitter wiring line 23E include a portion that extends from one of conductor patterns that form the first-layer emitter wiring line 22E of each of the unit transistors 20, that passes above the base electrode, and that reaches the other conductor pattern. Furthermore, the second-layer emitter wiring line 23E has a portion extending over the plurality of active regions 21 in the y-axis direction and connects the emitter electrodes of the plurality of unit transistors 20 together. The portion of the second-layer emitter wiring line 23E extending in the y-axis direction partially overlaps the first-layer collector wiring lines 22C.

The second-layer emitter wiring line 23E includes a plurality of comb-tooth portions that extend from the portion extending in the y-axis direction toward the emitter common wiring line 11 in a comb-tooth shape. Leading ends of the comb-tooth portions of the second-layer emitter wiring line 23E overlap the emitter common wiring line 11 and are connected to the emitter common wiring line 11 through interlayer connection vias provided in the overlapping portions.

A plurality of via-holes 40 are formed so as to overlap the emitter common wiring line 11. The via-holes 40 are arranged, for example, in the direction in which the emitter common wiring line 11 extends (the y-axis direction). For example, one via-hole 40 is formed for two unit transistors 20, and the via-hole 40 is arranged at the center between the two unit transistors 20 with respect to the y-axis direction.

A plurality of input capacitive elements 30 are arranged in the input capacitor region 10 on the side opposite to the transistor region 12 as viewed from the emitter common wiring line 11. The input capacitive elements 30 each include a lower-layer electrode 30L included in the first-layer wiring layer, an upper-layer electrode 30U included in the second-layer wiring layer, and an insulator film disposed between the lower-layer electrode 30L and the upper-layer electrode 30U.

A plurality of base wiring lines 23B included in the second-layer wiring layer intersect the emitter common wiring line 11. One end of each of the second-layer base wiring lines 23B overlaps a portion of the corresponding lower-layer electrode 30L and is connected to the lower-layer electrode 30L through an interlayer connection via provided in the overlapping portion. The other end of each of the second-layer base wiring lines 23B overlaps the first-layer base wiring line 22B and is connected to the first-layer base wiring line 22B through an interlayer connection via provided in the overlapping portion.

The comb-tooth portions of the second-layer emitter wiring line 23E are arranged so as to avoid the second-layer base wiring lines 23B. For example, the comb-tooth portions of the second-layer emitter wiring line 23E and the second-layer base wiring lines 23B are alternately arranged in the y-axis direction.

The second-layer base wiring lines 23B are arranged on an extension of regions of the second-layer emitter wiring line 23E extending in the x-axis direction, the regions overlapping the first-layer emitter wiring lines 22E. Therefore, the second-layer emitter wiring line 23E cannot be linearly extended from the regions overlapping the first-layer emitter wiring lines 22E toward the emitter common wiring line 11.

The second-layer emitter wiring line 23E extends from the portions overlapping the first-layer emitter wiring lines 22E, passes above the first-layer collector wiring lines 22C so as to avoid the second-layer base wiring lines 23B in the y-axis direction, and is continuous with the comb-tooth portions. The linear distance from a unit transistor 20 to the corresponding via-hole 40 is uniform in the plurality of unit transistors 20, and the wiring-line length of the second-layer emitter wiring line 23E is also uniform.

Each of the lower-layer electrodes 30L of the input capacitive elements 30 is connected to the common bias wiring line 34 with the corresponding resistive element 32 interposed therebetween, the common bias wiring line 34 and the resistive element 32 being included in the first-layer wiring layer. The lower-layer electrodes 30L and the resistive elements 32 are arranged in the same first-layer wiring layer, and no interlayer insulating films are disposed between the lower-layer electrodes 30L and the corresponding resistive elements 32. The upper-layer electrodes 30U of the input capacitive elements 30 are continuous with the input signal wiring line 33 included in the second-layer wiring layer.

Figure 3A:
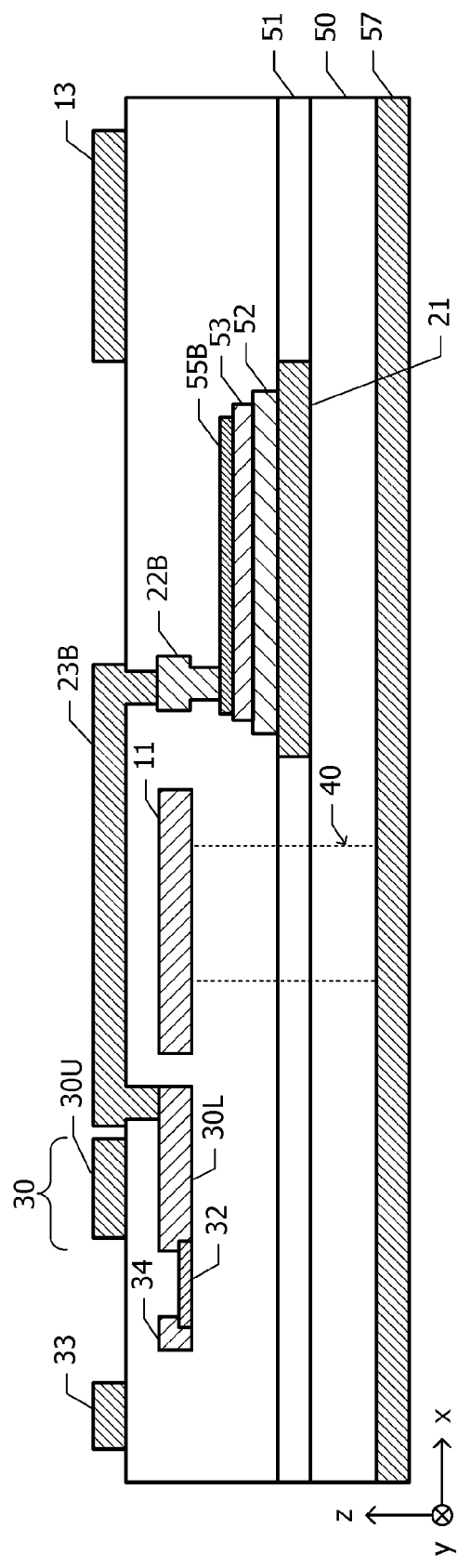
FIG. 3A is a sectional view taken along dash-dotted line 3A-3A in FIG. 2.
Figure 3B:
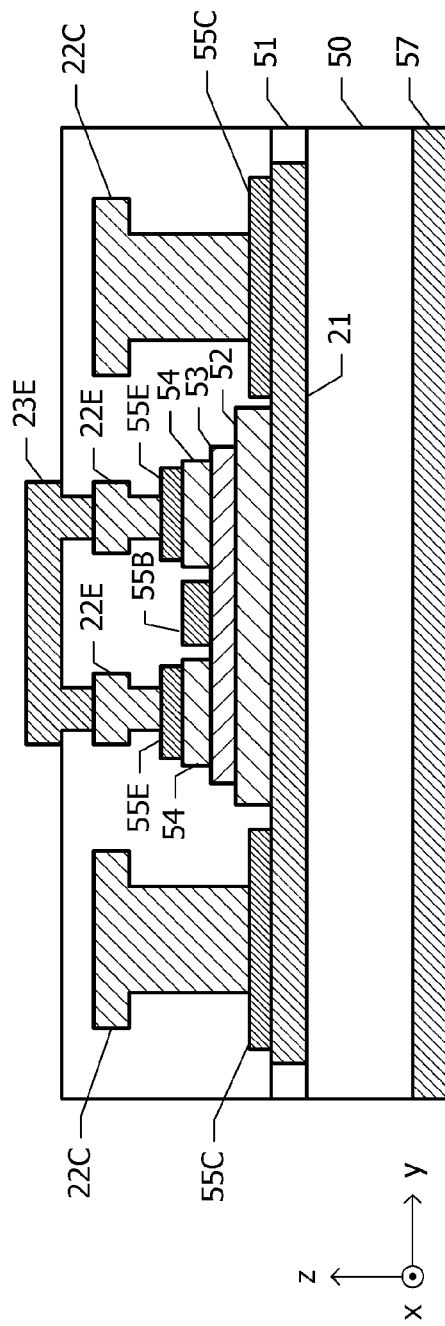
FIG. 3B is a sectional view taken along dash-dotted line 3B-3B in FIG. 2.

FIG. 3A is a sectional view taken along dash-dotted line 3A-3A in FIG. 2, and FIG. 3B is a sectional view taken along dash-dotted line 3B-3B in FIG. 2. An n-type sub-collector layer 51 is epitaxially grown on a substrate 50 made of a semi-insulating compound semiconductor, for example, GaAs. A part of the sub-collector layer 51 other than an active region 21 in which a unit transistor 20 is arranged is insulated by ion implantation.

A collector layer 52 and a base layer 53 are stacked on a partial region of the active region 21. A base electrode 55B is disposed on the base layer 53, and an emitter layer 54 (FIG. 3B) is arranged on both sides of the base electrode 55B. The collector layer 52, the base layer 53, and the emitter layer 54 form a heterojunction bipolar transistor.

Collector electrodes 55C (FIG. 3B) are disposed on the active region 21 on both sides of the collector layer 52. Emitter electrodes 55E (FIG. 3B) are disposed on the emitter layer 54. The collector electrodes 55C are ohmically connected to the collector layer 52 through the active region 21 of the sub-collector layer 51. The base electrode 55B and the emitter electrodes 55E are ohmically connected to the base layer 53 and the emitter layer 54, respectively.

A base wiring line 22B (FIG. 3A), an emitter wiring line 22E (FIG. 3B), a collector wiring line 22C (FIG. 3B), an emitter common wiring line 11 (FIG. 3A), a lower-layer electrode 30L (FIG. 3A) of an input capacitive element 30, a resistive element 32 (FIG. 3A), and a bias wiring line 34 (FIG. 3A) are arranged in a first-layer wiring layer. The base wiring line 22B is connected to an end portion of the base electrode 55B (the left end in FIG. 3A). The emitter common wiring line 11 is connected, through a via-hole 40, to a ground plane 57 disposed on a back surface of the substrate 50. The lower-layer electrode 30L of the input capacitive element 30 is connected to the bias wiring line 34 with the resistive element 32 interposed therebetween.

The first-layer collector wiring line 22C is connected to the collector electrodes 55C. The first-layer emitter wiring line 22E (FIG. 3B) is connected to the emitter electrodes 55E.

A base wiring line 23B (FIG. 3A), an emitter wiring line 23E (FIG. 3B), a collector common wiring line 13 (FIG. 3A), an upper-layer electrode 30U (FIG. 3A) of the input capacitive element 30, and an input signal wiring line 33 (FIG. 3A) are arranged in a second-layer wiring layer. At an intersection of the second-layer base wiring line 23B and the first-layer emitter common wiring line 11, an interlayer insulating film is disposed between the base wiring line 23B and the emitter common wiring line 11 to insulate these wiring lines from each other. The second-layer base wiring line 23B passes above the emitter common wiring line 11 and connects the lower-layer electrode 30L to the first-layer base wiring line 22B. The second-layer emitter wiring line 23E passes above the base electrode 55B and connects a pair of conductor patterns of the first-layer emitter wiring line 22E to each other.

Next, advantageous effects obtained as a result of adopting the configuration of the semiconductor device according to the first embodiment will be described.

When the input capacitive elements 30 and the emitter common wiring line 11 are arranged at substantially the same positions with respect to the x-axis direction in order to made the input capacitive elements 30 close to the unit transistors 20, the via-holes 40 must be arranged so as to avoid the input capacitive elements 30. Therefore, emitter wiring-line lengths from the unit transistors 20 to the via-holes 40 vary widely. Unit transistors 20 having long emitter wiring-line lengths to via-holes 40 have high emitter resistances. Consequently, characteristics, such as gains, of the transistors may decrease.

In the first embodiment, the emitter common wiring line 11 is arranged between the input capacitor region 10 (FIGS. 1 and 2) and the transistor region 12 with respect to the x-axis direction. Therefore, the via-holes 40 can be arranged so as to overlap the emitter common wiring line 11 without being restricted by the arrangement of the input capacitive elements 30 (FIG. 2). For example, one via-hole 40 is arranged for two unit transistors 20, so that the length of the emitter wiring line from the unit transistors 20 to the via-hole 40 can be made short and uniform. As a result, an increase in the emitter resistance can be suppressed, and a decrease in characteristics such as gains can be suppressed.

Even when the emitter common wiring line 11 is arranged between the input capacitive elements 30 and the unit transistors 20, the input capacitive elements 30 can be connected to the corresponding base electrodes 55B (FIG. 3B) of the unit transistors 20 by using the second-layer base wiring lines 23B disposed above the emitter common wiring line 11. By arranging the emitter common wiring line 11 as a layer located below the second-layer base wiring lines 23B, the second-layer base wiring lines 23B and the via-holes 40 can be arranged so as to overlap each other in plan view.

When the input capacitive elements 30 are connected to the corresponding base electrodes 55B with the second-layer base wiring lines 23B interposed therebetween, it is difficult to linearly extend the second-layer emitter wiring line 23E (FIG. 2) from regions where the second-layer emitter wiring line 23E overlaps the first-layer emitter wiring lines 22E toward the emitter common wiring line 11. In the first embodiment, the second-layer emitter wiring line 23E extends in the y-axis direction from regions where the second-layer emitter wiring line 23E overlaps the first-layer emitter wiring lines 22E, passes above the first-layer collector wiring lines 22C, and further extends toward the emitter common wiring line 11. By adopting this planar shape, the emitter electrodes 55E (FIG. 3B) can be connected to the emitter common wiring line 11.

In the first embodiment, the lower-layer electrode 30L (FIG. 2) of an input capacitive element 30 connected to the base layer 53 of a unit transistor 20 is arranged for each unit transistor 20. Thus, the resistive element 32 (FIG. 2) functioning as a ballast resistor can be arranged for each unit transistor 20.

Next, advantageous effects obtained by adopting the configuration of the semiconductor device according to the first embodiment will be described in comparison with the semiconductor device according to a comparative example illustrated in FIG. 6.

FIG. 6 is a plan view of a semiconductor device according to a comparative example. In the first embodiment (FIG. 2), the emitter common wiring line 11 is arranged between the input capacitor region 10 and the transistor region 12. In contrast, in the comparative example, an input capacitor region 10 is arranged on one side (the left side in FIG. 6) of a transistor region 12, and an emitter common wiring line 11 is arranged on the other side (the right side in FIG. 6) of the transistor region 12. With this configuration, lower-layer electrodes 30L of input capacitive elements 30 can be directly connected to base electrodes 55B without a second-layer wiring layer interposed therebetween. Furthermore, the emitter common wiring line 11 can be directly connected to emitter electrodes 55E (FIG. 3B) without a second-layer wiring layer interposed therebetween.

A collector common wiring line 13 provided in a second-layer wiring layer can be arranged so as to overlap the emitter common wiring line 11 provided in first-layer wiring layer. However, overlapping via-holes 40 and pads 60 for collectors is not preferred from the viewpoint of the production process. Therefore, the pads 60 for collectors must be arranged at distant positions, as viewed from the unit transistors 20, so as to avoid a region where the via-holes 40 are arranged in the y-axis direction. Accordingly, the wiring-line length from collector electrodes 55C (FIG. 3B) to the pads 60 for collectors is increased. As a result, the output power of the transistors decreases.

In the first embodiment (FIG. 2), since neither the emitter common wiring line 11 nor the via-holes 40 are arranged between the transistor region 12 and the collector common wiring line 13, the collector electrodes 55C (FIG. 3B) and the pad 60 for collectors can be made close to each other. As a result, the decrease in the output power of the transistors can be suppressed.

Second Embodiment

Next, a semiconductor device according to a second embodiment will be described with reference to FIGS. 4, 5A, and 5B. Hereinafter, descriptions of configurations that are common to those of the semiconductor device according to the first embodiment will be omitted.

Figure 4:
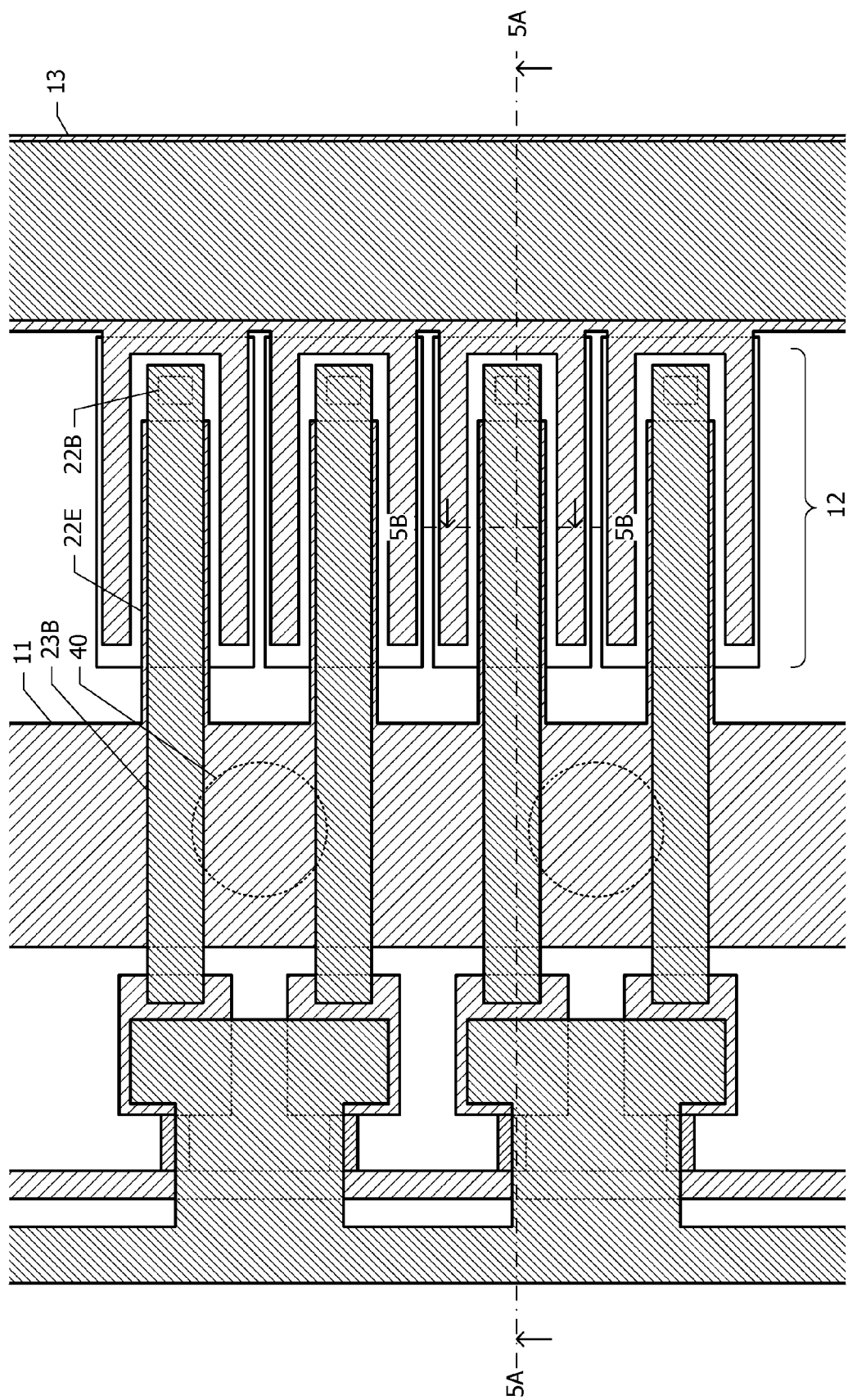
FIG. 4 is a plan view of a semiconductor device according to a second embodiment.
Figure 5A:
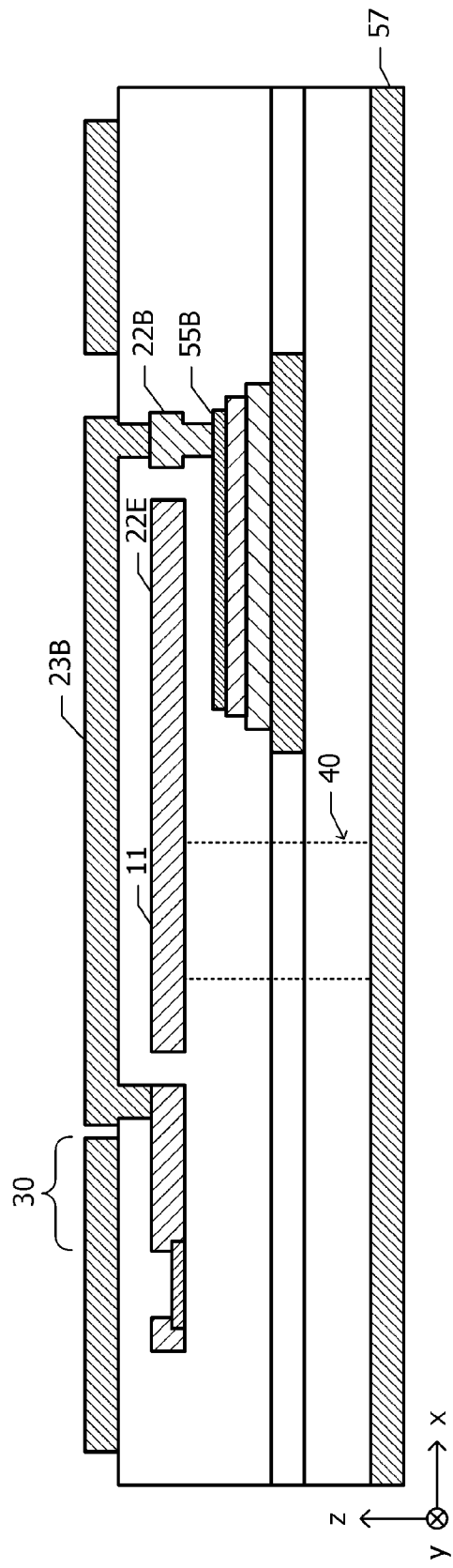
FIG. 5A is a sectional view taken along dash-dotted line 5A-5A in FIG. 4.
Figure 5B:
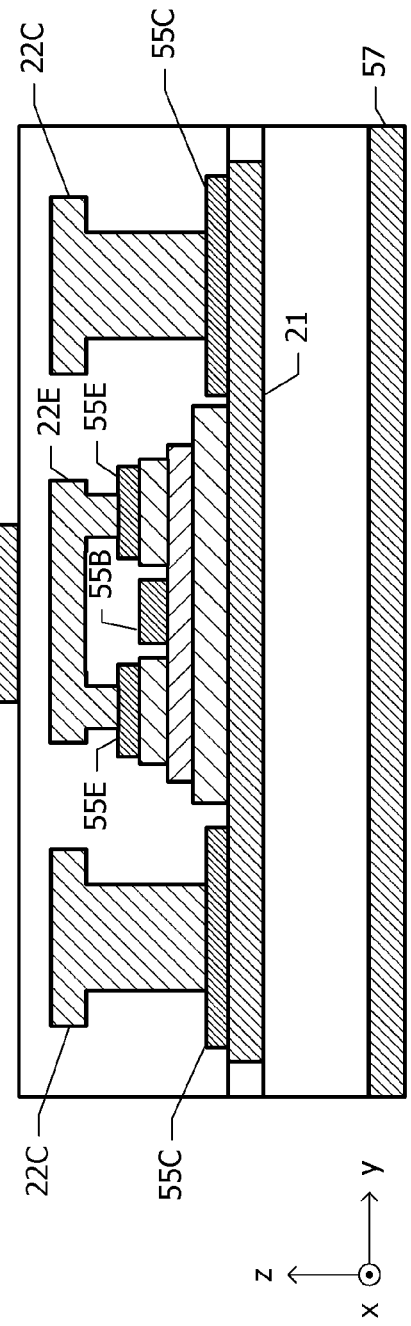
FIG. 5B is a sectional view taken along dash-dotted line 5B-5B in FIG. 4.

FIG. 4 is a plan view of a semiconductor device according to the second embodiment. FIG. 5A is a sectional view taken along dash-dotted line 5A-5A in FIG. 4, and FIG. 5B is a sectional view taken along dash-dotted line 5B-5B in FIG. 4. In the first embodiment (FIG. 2), the first-layer base wiring line 22B (FIG. 3A) is arranged at an end portion of the base electrode 55B on the side close to the emitter common wiring line 11. In the second embodiment, a first-layer base wiring line 22B (FIGS. 4 and 5A) is arranged at an end portion of a base electrode 55B (FIG. 5A) on the side opposite to an emitter common wiring line 11.

A second-layer base wiring line 23B (FIG. 5A) passes above the emitter common wiring line 11, further passes above the base electrode 55B and a first-layer emitter wiring line 22E, and is connected to the first-layer base wiring line 22B. The first-layer base wiring line 22B is not arranged in a region extending from a central portion of the base electrode 55B to the emitter common wiring line 11. Each of the first-layer emitter wiring lines 22E extends from the emitter common wiring line 11 (FIGS. 4 and 5A) to a region where the first-layer emitter wiring line 22E overlaps the corresponding base electrode 55B and emitter electrodes 55E (FIG. 5B). The emitter common wiring line 11 and the first-layer emitter wiring lines 22E are formed by a single conductor pattern.

Next, advantageous effects obtained as a result of adopting the configuration of the semiconductor device according to the second embodiment will be described.

In the second embodiment, via-holes 40 can be arranged without being affected by the arrangement of input capacitive elements 30 as in the first embodiment. Furthermore, in the second embodiment, each of the first-layer emitter wiring lines 22E can linearly connects the region where the emitter wiring line 22E overlaps the emitter electrodes 55E (FIG. 5B) to the emitter common wiring line 11 at the shortest distance. Therefore, the inductance and the resistance of a wiring line from a ground plane 57 (FIGS. 5A and 5B) to the emitter electrodes 55E through a via-hole 40 can be reduced. In addition, since neither the emitter common wiring line 11 nor the via-holes 40 are arranged between a transistor region 12 and a collector common wiring line 13, collector electrodes 55C and a pad 60 for collectors can be made close to each other. Accordingly, parasitic resistance components inserted into the collectors can be reduced, and a decrease in the output power of the transistors can be suppressed. As a result, characteristics of the power amplifier can be improved.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

Disclosures of semiconductor devices according to a first aspect to a sixth aspect are derived on the basis of the embodiments described above.

A semiconductor device according to the first aspect includes a plurality of unit transistors that are arranged on a first surface of a substrate in a first direction and that each include a base layer, an emitter layer, and a collector layer; input capacitive elements arranged so as to correspond to the unit transistors and connected to the base layers of the corresponding unit transistors; an emitter common wiring line connected to the emitter layers of the unit transistors; a via-hole that is disposed at a position overlapping the emitter common wiring line and that extends from the emitter common wiring line to a second surface of the substrate, the second surface being opposite to the first surface; and a collector common wiring line connected to the collector layers of the unit transistors. In the semiconductor device, an input capacitor region in which the input capacitive elements are arranged, the emitter common wiring line, a transistor region in which the unit transistors are arranged, and the collector common wiring line are arranged in this order in a second direction intersecting the first direction, and base wiring lines that connect the input capacitive elements to the base layers of the corresponding unit transistors intersect the emitter common wiring line without physical contact.

The input capacitive elements do not affect the arrangement of the via-hole. Therefore, the distance from the via-hole to the unit transistors can be shortened. As a result, the emitter resistance can be reduced without increasing the collector resistance. Thus, a decrease in the output power can be suppressed to realize an improvement in the gain.

A semiconductor device according to the second aspect has the configuration of the semiconductor device according to the first aspect, in which the base wiring lines are disposed above the emitter common wiring line with an insulating film interposed therebetween at intersections of the base wiring lines and the emitter common wiring line.

The arrangement of the via-hole disposed under the emitter common wiring line is not affected by the base wiring lines. Therefore, the degree of freedom of the arrangement of the via-hole increases. As a result, the distance from the via-hole to the emitter layers of the unit transistors can be shortened.

A semiconductor device according to the third aspect has the configuration of the semiconductor device according to the first or second aspect, in which the input capacitive elements each include a lower-layer electrode connected to the base wiring line and an upper-layer electrode disposed above the lower-layer electrode with an insulating film interposed therebetween, and the semiconductor device further includes an input signal wiring line that is disposed in a wiring layer located above a wiring layer in which the lower-layer electrode is disposed and that supplies an input signal to the upper-layer electrode. An input signal is supplied from the input signal wiring line to the base layers of the unit transistors through the input capacitive elements and the base wiring lines.

A semiconductor device according to the fourth aspect has the configuration of the semiconductor device according to the third aspect and further includes a plurality of resistive elements connected to the corresponding lower-layer electrodes; and a bias wiring line that is disposed in the same wiring layer as the lower-layer electrodes and that supplies a bias to the base layers of the unit transistors through the resistive elements and the lower-layer electrodes, in which no insulating film is disposed between a layer in which the resistive elements are disposed and the layer in which the lower-layer electrodes and the bias wiring line are disposed. Connection can be established from the lower-layer electrode to the bias wiring line with the resistive element interposed therebetween without a via for connecting the upper wiring layer to the lower wiring layer.

A semiconductor device according to the fifth aspect has the configuration of the semiconductor device according to any one of the first to fourth aspects and further includes collector wiring lines that connect the collector layers of the unit transistors to the collector common wiring line and that are disposed in a wiring layer located below the collector common wiring line; and emitter wiring lines that pass above the collector wiring lines to connect the emitter layers of the unit transistors to the emitter common wiring line. With the configuration in which the emitter wiring lines pass above the collector wiring lines, the emitter wiring lines can be guided from the emitter layers to the emitter common wiring line while detouring the base wiring lines.

A semiconductor device according to the sixth aspect has the configuration of the semiconductor device according to any one of the first to fourth aspects and further includes emitter wiring lines that are disposed in the same wiring layer as the emitter common wiring line, that are formed by a single conductor pattern including the emitter common wiring line, and that are connected to the emitter layers of the unit transistors, in which the base wiring lines pass above the emitter wiring lines and are connected to the base layers of the corresponding unit transistors. Since the base wiring lines do not affect guiding of the emitter wiring lines, the lengths of the emitter wiring lines extending from the emitter layers to the emitter common wiring line can be reduced.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
a plurality of unit transistors that are arranged on a first surface of a substrate in a first direction and that each include a base layer, an emitter layer, and a collector layer;
input capacitive elements arranged so as to correspond to the unit transistors and connected to the base layers of the corresponding unit transistors;
an emitter common wiring line connected to the emitter layers of the unit transistors;
a via-hole that is disposed at a position overlapping the emitter common wiring line and that extends from the emitter common wiring line to a second surface of the substrate, the second surface being opposite to the first surface; and
a collector common wiring line connected to the collector layers of the unit transistors,
wherein
an input capacitor region in which the input capacitive elements are arranged, the emitter common wiring line, a transistor region in which the unit transistors are arranged, and the collector common wiring line are arranged in this order in a second direction intersecting the first direction, and
base wiring lines that connect the input capacitive elements to the base layers of the corresponding unit transistors intersect the emitter common wiring line without physical contact.

2. The semiconductor device according to claim 1, wherein the base wiring lines are disposed above the emitter common wiring line with an insulating film interposed therebetween at intersections of the base wiring lines and the emitter common wiring line.

3. The semiconductor device according to claim 1, wherein
the input capacitive elements each include a lower-layer electrode connected to the base wiring line and an upper-layer electrode disposed above the lower-layer electrode with an insulating film interposed therebetween, and
the semiconductor device further comprises an input signal wiring line that is disposed in a wiring layer located above a wiring layer in which the lower-layer electrode is disposed and that supplies an input signal to the upper-layer electrode.

4. The semiconductor device according to claim 3, further comprising:
a plurality of resistive elements connected to the corresponding lower-layer electrodes; and
a bias wiring line that is disposed in the same wiring layer as the lower-layer electrodes and that supplies a bias to the base layers of the unit transistors through the resistive elements and the lower-layer electrodes,
wherein no insulating film is disposed between a layer in which the resistive elements are disposed and the layer in which the lower-layer electrodes and the bias wiring line are disposed.

5. The semiconductor device according to claim 1, further comprising:
collector wiring lines that connect the collector layers of the unit transistors to the collector common wiring line and that are disposed in a wiring layer located below the collector common wiring line; and
emitter wiring lines that pass above the collector wiring lines to connect the emitter layers of the unit transistors to the emitter common wiring line.

6. The semiconductor device according to claim 1, further comprising:
emitter wiring lines that are disposed in the same wiring layer as the emitter common wiring line, that are formed by a single conductor pattern including the emitter common wiring line, and that are connected to the emitter layers of the unit transistors,
wherein the base wiring lines pass above the emitter common wiring lines and are connected to the base layers of the corresponding unit transistors.

7. The semiconductor device according to claim 2, wherein
the input capacitive elements each include a lower-layer electrode connected to the base wiring line and an upper-layer electrode disposed above the lower-layer electrode with an insulating film interposed therebetween, and
the semiconductor device further comprises an input signal wiring line that is disposed in a wiring layer located above a wiring layer in which the lower-layer electrode is disposed and that supplies an input signal to the upper-layer electrode.

8. The semiconductor device according to claim 7, further comprising:
a plurality of resistive elements connected to the corresponding lower-layer electrodes; and
a bias wiring line that is disposed in the same wiring layer as the lower-layer electrodes and that supplies a bias to the base layers of the unit transistors through the resistive elements and the lower-layer electrodes,
wherein no insulating film is disposed between a layer in which the resistive elements are disposed and the layer in which the lower-layer electrodes and the bias wiring line are disposed.

9. The semiconductor device according to claim 2, further comprising:
collector wiring lines that connect the collector layers of the unit transistors to the collector common wiring line and that are disposed in a wiring layer located below the collector common wiring line; and
emitter wiring lines that pass above the collector wiring lines to connect the emitter layers of the unit transistors to the emitter common wiring line.

10. The semiconductor device according to claim 3, further comprising:
collector wiring lines that connect the collector layers of the unit transistors to the collector common wiring line and that are disposed in a wiring layer located below the collector common wiring line; and
emitter wiring lines that pass above the collector wiring lines to connect the emitter layers of the unit transistors to the emitter common wiring line.

11. The semiconductor device according to claim 4, further comprising:
collector wiring lines that connect the collector layers of the unit transistors to the collector common wiring line and that are disposed in a wiring layer located below the collector common wiring line; and
emitter wiring lines that pass above the collector wiring lines to connect the emitter layers of the unit transistors to the emitter common wiring line.

12. The semiconductor device according to claim 7, further comprising:
collector wiring lines that connect the collector layers of the unit transistors to the collector common wiring line and that are disposed in a wiring layer located below the collector common wiring line; and emitter wiring lines that pass above the collector wiring lines to connect the emitter layers of the unit transistors to the emitter common wiring line.

13. The semiconductor device according to claim 8, further comprising:
   collector wiring lines that connect the collector layers of the unit transistors to the collector common wiring line and that are disposed in a wiring layer located below the collector common wiring line; and
   emitter wiring lines that pass above the collector wiring lines to connect the emitter layers of the unit transistors to the emitter common wiring line.

14. The semiconductor device according to claim 2, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

15. The semiconductor device according to claim 3, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

16. The semiconductor device according to claim 4, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

17. The semiconductor device according to claim 5, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

18. The semiconductor device according to claim 7, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

19. The semiconductor device according to claim 8, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

20. The semiconductor device according to claim 9, further comprising:
   emitter wiring lines that are disposed in the same wiring layer as the emitter common wiring line, that are formed by a single conductor pattern including the emitter common wiring line, and that are connected to the emitter layers of the unit transistors,
   wherein the base wiring lines pass above the emitter common wiring lines and are connected to the base layers of the corresponding unit transistors.

* * * * *